United States Patent
Chen et al.

(10) Patent No.: US 8,837,168 B2
(45) Date of Patent: Sep. 16, 2014

(54) ELECTRONIC PACKAGE STRUCTURE

(71) Applicant: Cyntec Co., Ltd., Hsinchu (TW)

(72) Inventors: Da-Jung Chen, Taoyuan County (TW); Chau-Chun Wen, Taoyuan County (TW); Chun-Tiao Liu, Hsinchu (TW)

(73) Assignee: Cyntec Co., Ltd., Hsinchu (TW)

( * ) Notice: Subject to any disclaimer, the term of this patent is extended or adjusted under 35 U.S.C. 154(b) by 0 days.

(21) Appl. No.: 13/754,910

(22) Filed: Jan. 31, 2013

(65) Prior Publication Data

US 2013/0141886 A1 Jun. 6, 2013

Related U.S. Application Data

(60) Continuation of application No. 12/971,671, filed on Dec. 17, 2010, now abandoned, which is a division of application No. 12/143,143, filed on Jun. 20, 2008, now abandoned.

(30) Foreign Application Priority Data

Feb. 18, 2008  (TW) ................ 97105555 A

(51) Int. Cl.
| | |
|---|---|
| H05K 7/18 | (2006.01) |
| H05K 3/30 | (2006.01) |
| H05K 1/18 | (2006.01) |
| H01L 23/64 | (2006.01) |
| H01L 25/16 | (2006.01) |
| H01F 27/29 | (2006.01) |
| H05K 9/00 | (2006.01) |
| H01L 23/24 | (2006.01) |
| H01L 23/31 | (2006.01) |
| H01L 23/552 | (2006.01) |
| H01F 27/02 | (2006.01) |
| H05K 3/34 | (2006.01) |

(52) U.S. Cl.
  CPC ........ *H05K 1/18* (2013.01); *H01L 2224/73265* (2013.01); *H05K 3/30* (2013.01); *H01L 2224/32225* (2013.01); *H01L 23/24* (2013.01); *H01L 2924/19105* (2013.01); *H01L 2924/13055* (2013.01); *H01L 23/3121* (2013.01); *H05K 2201/10515* (2013.01); *H01L 23/552* (2013.01); *H01L 23/645* (2013.01); *H05K 2201/10537* (2013.01); *H01L 25/16* (2013.01); *H01L 2924/13091* (2013.01); *H01F 27/29* (2013.01); *H05K 9/00* (2013.01); *H01F 27/027* (2013.01); *H05K 3/3421* (2013.01); *H05K 2201/1003* (2013.01); *H05K 2201/10924* (2013.01); *H05K 1/181* (2013.01); *H01L 2224/48227* (2013.01)
  USPC ........... 361/813; 361/103; 361/528; 257/673; 257/758; 257/784; 336/200; 29/605

(58) Field of Classification Search
  USPC .......... 361/813, 103, 528; 257/673, 758, 784; 336/200; 29/605
  See application file for complete search history.

(56) References Cited

U.S. PATENT DOCUMENTS

| | | | | |
|---|---|---|---|---|
| 4,096,581 A | * | 6/1978 | Carlo et al. | 365/2 |
| 4,696,100 A | * | 9/1987 | Yamamoto et al. | 29/605 |

(Continued)

*Primary Examiner* — Xiaoliang Chen
(74) *Attorney, Agent, or Firm* — Litron Patent & Trademark Office; Min-Lee Teng

(57) ABSTRACT

An electronic package structure including at least one first electronic element, a second electronic element and a lead frame is provided. The second electronic element includes a body having a cavity. The first electronic element is disposed in the cavity. The lead frame has a plurality of leads. Each of the leads has a first end and a second end. The first end of at least one of the leads extends to the cavity to electrically connect the first electronic element.

15 Claims, 5 Drawing Sheets

(56) References Cited

U.S. PATENT DOCUMENTS

| | | | |
|---|---|---|---|
| 6,198,375 B1 * | 3/2001 | Shafer | 336/225 |
| 6,242,798 B1 * | 6/2001 | Cha et al. | 257/673 |
| 6,320,251 B1 * | 11/2001 | Glenn | 257/678 |
| 6,593,841 B1 * | 7/2003 | Mizoguchi et al. | 336/200 |
| 6,730,544 B1 * | 5/2004 | Yang | 438/110 |
| 6,741,451 B2 * | 5/2004 | Aoyama | 361/528 |
| 2001/0017420 A1 * | 8/2001 | Iwao et al. | 257/758 |
| 2006/0215342 A1 * | 9/2006 | Montoya et al. | 361/103 |
| 2008/0029907 A1 * | 2/2008 | Koduri | 257/784 |
| 2008/0036566 A1 * | 2/2008 | Klesyk et al. | 336/84 M |
| 2008/0179722 A1 * | 7/2008 | Chen et al. | 257/666 |
| 2008/0180921 A1 * | 7/2008 | Chen et al. | 361/729 |
| 2008/0303125 A1 * | 12/2008 | Chen et al. | 257/676 |

* cited by examiner

ELECTRONIC PACKAGE STRUCTURE

CROSS-REFERENCE TO RELATED APPLICATION

This application is a continuation of U.S. patent application Ser. No. 12/971,671 filed on Dec. 17, 2010, now U.S. Pub. No. 2011/0090648, which is a divisional of U.S. patent application Ser. No. 12/143,143 filed on Jun. 20, 2008, now U.S. Pub. No. 2009/0207574, now abandoned, which claims priority of Taiwan application Ser. No. 97105555 filed on Feb. 18, 2008. The entirety of the above-mentioned patent applications are hereby incorporated by reference herein and made a part of specification.

BACKGROUND OF THE INVENTION

1. Field of the Invention

The present invention relates to a package structure. More particularly, the present invention relates to an electronic package structure.

2. Description of Related Art

Electronic package structures are formed by complicated package processes. Different electronic package structures have different electrical performances and capacities of heat dissipation, and therefore a designer may select an electronic package structure with a desired electrical performance and capacity of heat dissipation according to a design requirement.

FIG. 1 is a schematic diagram of a conventional electronic package structure. Referring to FIG. 1, the conventional electronic package structure 100 includes a printed circuit board (PCB) 110 and a plurality of electronic elements 120. The electronic elements 120 are disposed on a surface 112 of the PCB 110 and electrically connected to the PCB 110. The PCB 110 has a plurality of pins 116 extending out from another surface 114 of the PCB 110 to be electrically connected to an electronic device, for example, a motherboard (not shown).

FIG. 2 is a schematic diagram of another conventional electronic package structure. Referring to FIG. 2, the conventional electronic package structure 200 includes a circuit substrate 210 and a plurality of electronic elements 220. The electronic elements 220 are disposed on a surface 212 of the circuit substrate 210, and electrically connected to the circuit substrate 210 via a wire bonding technology, a flip-chip bonding technology or a surface mount technology. Moreover, the conventional electronic package structure 200 may be electrically connected to an electronic device, for example, a motherboard (not shown), via a solder paste or a plurality of solder balls (not shown).

It should be noted that the electronic elements 120 of the conventional electronic package structure 100 are all disposed on the surface 112 of the PCB 110, and the electronic elements 220 of the conventional electronic package structure 200 are all disposed on the surface 212 of the circuit substrate 210. Therefore, in the conventional electronic package structures 100 and 200, spatial utilization of the PCB 110 and the circuit substrate 210 is relatively low, and sizes of the conventional electronic package structures 100 and 200 are relatively great.

SUMMARY OF THE INVENTION

In accordance with the present invention, an electronic package structure can achieve a relatively high utilization of an internal space thereof, so that a size of the electronic package structure can be reduced.

In one embodiment of the present invention, an electronic package structure includes at least a first electronic element, a second electronic element and a first lead frame. The second electronic element includes a body having a cavity. The first electronic element is disposed in the cavity. The lead frame has a plurality of leads. Each of the leads has a first end and a second end, and the first end of at least one of the leads extends to the cavity to electrically connect the first electronic element.

In one embodiment of the present invention, an electronic package structure includes at least one first electronic element, a second electronic element and a lead frame. The second electronic element includes a body having a first surface. The lead frame has a plurality of leads. Each of the leads has a first end and a second end. The first ends are disposed on the first surface, and the first electronic element is disposed on the first surface and electrically connected to at least one of the leads.

In one embodiment, an electronic package structure includes a circuit substrate, at least one first electronic element and a second electronic element. The circuit substrate has a first surface. The first electronic element is disposed on the first surface of the circuit substrate and electrically connected to the circuit substrate. The second electronic element is disposed above the first surface of the circuit substrate and includes a body and a plurality of leads. Each of the leads has a first end and second end, and the second end of each of the leads extends out from the body to electrically connect the circuit substrate. The first electronic element is located among the body of the second electronic element, the first surface of the circuit substrate and the leads.

In the above embodiments of the present invention, since the first electronic element can be disposed in the cavity of the second electronic element or on the second electronic element, or the second electronic element can be stacked on the first electronic element, compared to the conventional electronic package structures, utilization of an internal space of the electronic package structure is relatively high.

In order to make the aforementioned and other objects, features and advantages of the present invention comprehensible, a preferred embodiment accompanied with figures is described in detail below.

DESCRIPTION OF EMBODIMENTS

First Embodiment

Figure 3A:
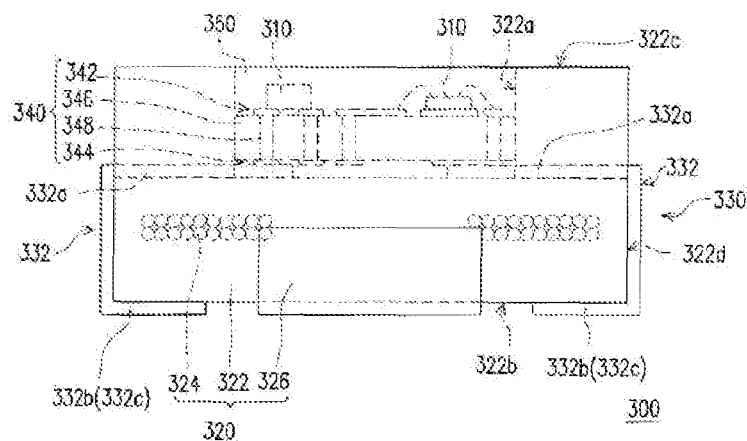
FIG. 3A is a schematic diagram of an electronic package structure according to a first embodiment of the present invention.

FIG. 3A is a schematic diagram of an electronic package structure according to a first embodiment of the present invention. Referring to FIG. 3A, the electronic package structure 300 includes at least one first electronic element 310 (two first electronic elements are illustrated in FIG. 3A), a second electronic element 320 and a first lead frame 330. The electronic package structure 300 is generally applied to a voltage regulator module, a network adapter, a graphics processing unit, a DC/DC converter or a point-of-load (POL) converter. Each of the first electronic elements 310 can be a logical control element, a driving element or a passive element. The passive element can be a capacitor, an inductor with lesser inductance, or a resistor. Each of the first electronic elements 310 can also be a power element, such as a metal-oxide-semiconductor field effect transistor (MOSFET), an insulated gate bipolar transistor (IGBT) or a diode.

The second electronic element 320 includes a body 322 having a cavity 322a. The first electronic elements 310 are disposed in the cavity 322a. In the embodiment, the body 322 of the second electronic element 320 has a first surface 322b, a second surface 322c opposite to the first surface 322b and a side surface 322d. The cavity 322a sinks in a direction from the second surface 322c towards the first surface 322b. The side surface 322d connects the first surface 322b and the second surface 322c. Besides, the second electronic element 320 can be an energy-storage element used for storing electric energy. In detail, the second electronic element 320 further includes a coil 324 and a plurality of first external electrodes 326. The coil 324 is disposed within the body 322. The first external electrodes 326 are respectively connected to two opposite ends of the coil 324, and extend outside the body 322 to locate on the first surface 322b and the side surface 322d. The body 322 comprising a magnetic body encloses the coil 324. The second electronic element 320 can be an inductive element with a greater inductance and a greater size than the first electronic elements 310.

The first lead frame 330 has a plurality of leads 332. Each of the leads 332 has a first end 332a and a second end 332b, and the first end 332a of each of the leads 332 can be embedded in the body 322 and extends to the cavity 322a for electrically connecting to the first electronic elements 310. The second end 332b of each of the leads 332 is disposed on the first surface 322b of the body 322 to form a second external electrode 332c, and a part of each of the leads 332 connecting the first end 332a and the second end 332b is disposed on the side surface 322d of the body 322.

In the present embodiment, the electronic package structure 300 further includes a circuit substrate 340 and an insulating encapsulant 350. The circuit substrate 340 is disposed in the cavity 322a of the body 322. The first electronic elements 310 can be disposed on the circuit substrate 340 and electrically connected to the circuit substrate 340. The circuit substrate 340 is electrically connected to the first end 332a of each of the leads 332 extending to the cavity 322a. The first electronic elements 310 may be electrically connected to the circuit substrate 340 via a wire bonding technology, a flip-chip bonding technology or a surface mount technology. The circuit substrate 340 has a first circuit layer 342, a second circuit layer 344, a dielectric layer 346 disposed between the first circuit layer 342 and the second circuit layer 344, and at least a conductive channel 348. The first electronic elements 310 are disposed on the first circuit layer 342, and the conductive channel 348 penetrates the dielectric layer 346 for electrically connecting the first circuit layer 342 and the second circuit layer 344. It should be noted that the circuit board 340 of the electronic package structure 300 may be omitted according to a design requirement of a designer, though it is not illustrated.

Moreover, the insulating encapsulant 350 is disposed in the cavity 322a and encapsulates the first electronic elements 310 and the circuit substrate 340 for protecting the first electronic elements 310 and the circuit substrate 340, and enhancing a whole mechanical strength of the electronic package structure 300.

Figure 1:
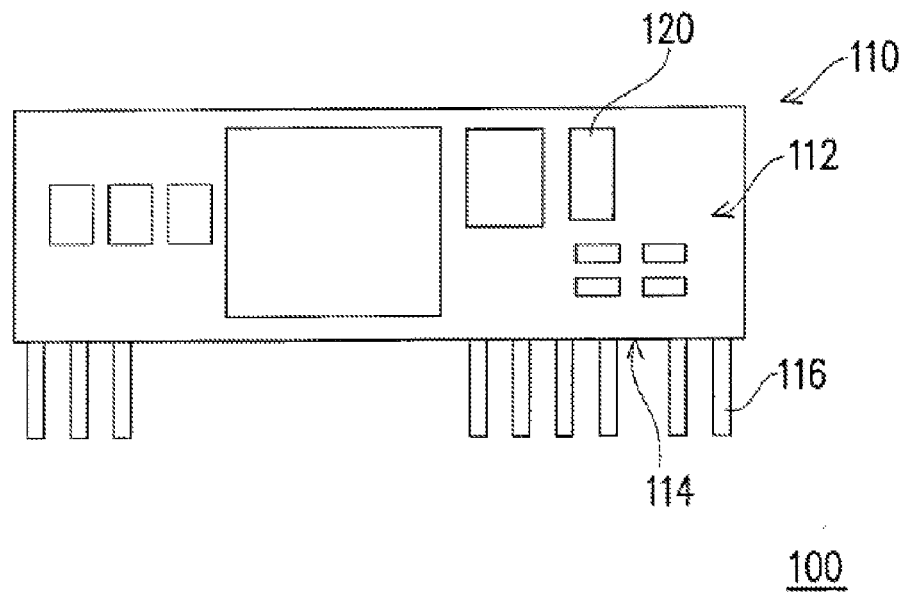
FIG. 1 is a schematic diagram of a conventional electronic package structure.
Figure 2:
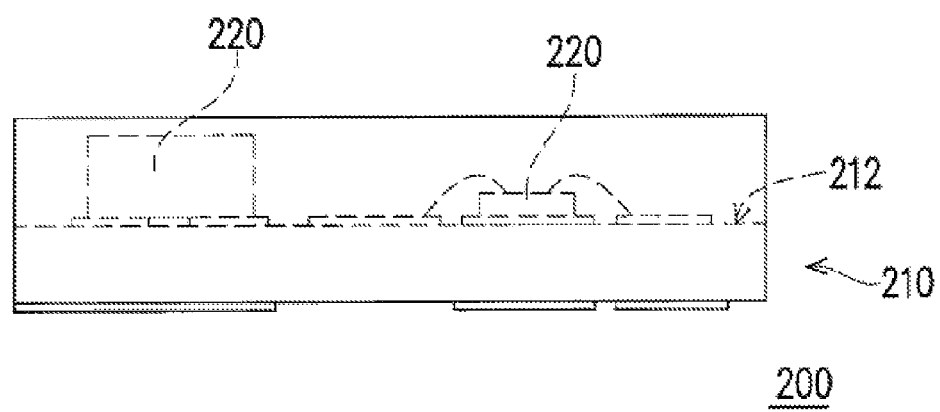
FIG. 2 is a schematic diagram of another conventional electronic package structure.

Since the first electronic elements 310 and the circuit substrate 340 are disposed in the cavity 322a of the second electronic element 320, compared to a conventional electronic package structures of FIG. 1 and FIG. 2, utilization of an internal space of the electronic package structure 300 is relatively high, and the first electronic elements 310 and the circuit substrate 340 can be protected by the cavity 322a. Besides, since the insulating encapsulant 350 is disposed in the cavity 322a, material of the insulating encapsulant 350 can be directly filled into the cavity 322a without aiding of extra mold during formation of the insulating encapsulant 350.

Figure 3B:
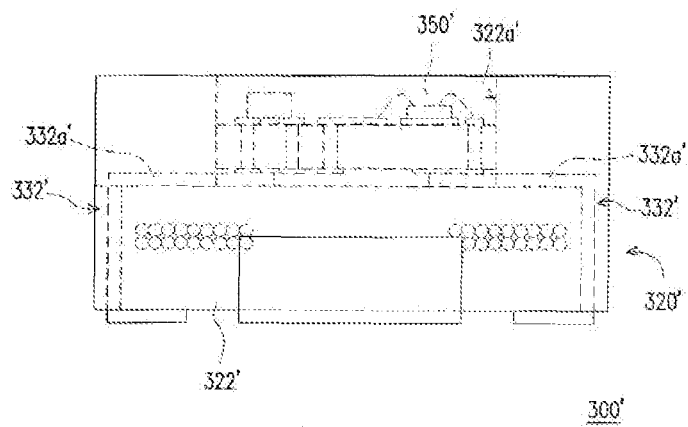
FIG. 3B is a schematic diagram of another electronic package structure according to the first embodiment of the present invention.

FIG. 3B is a schematic diagram of another electronic package structure according to the first embodiment of the present invention. Referring to FIG. 3A and FIG. 3B, a difference between the electronic package structure 300' and the electronic package structure 300 is that a part of each lead 332' connecting a first end 332a' and a second end 332b' penetrates a body 322'. Besides, the insulating encapsulant 350 of the electronic package structure 300 is different from a magnetic encapsulant 350' of the electronic package structure 300'. The magnetic encapsulant 350' is disposed in a cavity 322a' of the body 322'. Therefore, if a second electronic element 320' is an inductive element, an inductive characteristic of the second electronic element 320' influenced by the cavity 322' then can be compensated by the magnetic encapsulant 350'. It should be noted that a part of each of the leads 332 connecting the first end 332a and the second end 332b may also penetrate the body 322 according to a design requirement, though it is not illustrated.

Figure 3C:
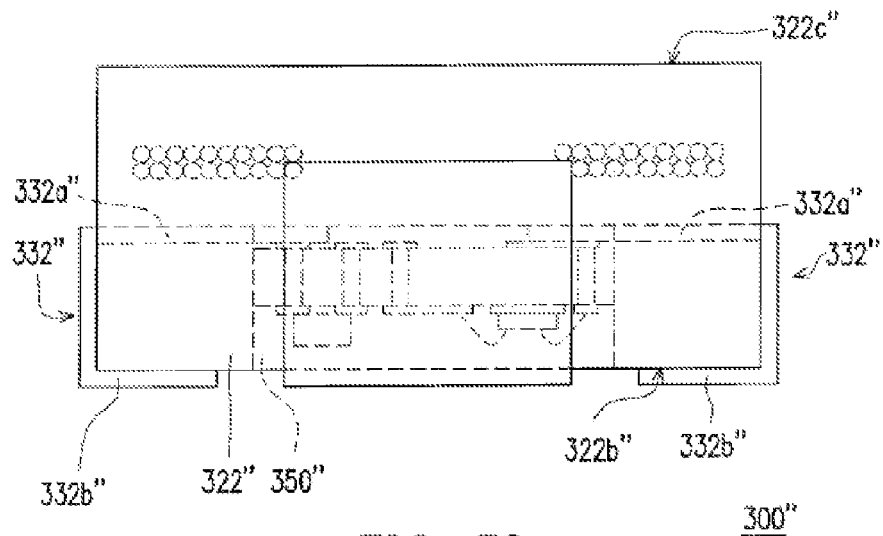
FIG. 3C is a schematic diagram of another electronic package structure according to the first embodiment of the present invention.

FIG. 3C is a schematic diagram of another electronic package structure according to the first embodiment of the present invention. Referring to FIG. 3A and FIG. 3C, a difference between the electronic package structure 300" and the electronic package structure 300 is that a cavity 322a" of a body 322" sinks in a direction from a first surface 322b" towards a second surface 322c". It should be noted that an insulating encapsulant 350" can be substituted by a magnetic encapsulant according to a design requirement, and a part of each lead 332" connecting a first end 332a" and a second end 332b" may also penetrate the body 322" according to a design requirement, though it is not illustrated.

Figure 3D:
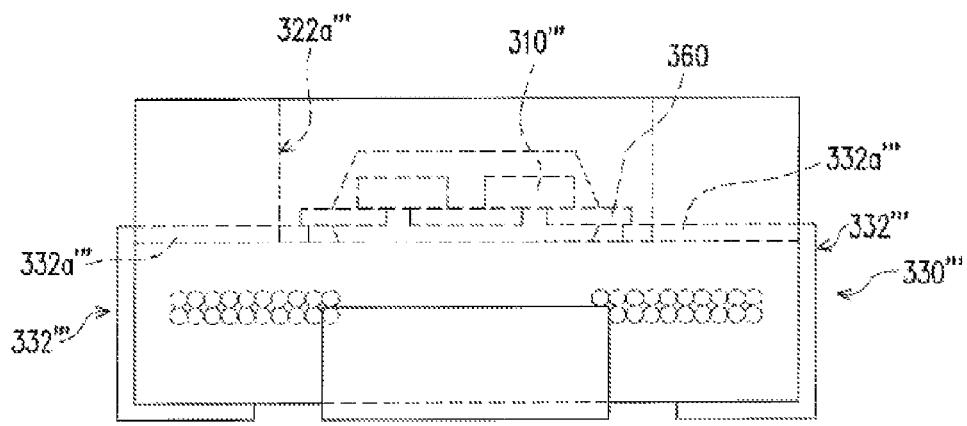
FIG. 3D is a schematic diagram of still another electronic package structure according to the first embodiment of the present invention.

FIG. 3D is a schematic diagram of still another electronic package structure according to the first embodiment of the present invention. Referring to FIG. 3A and FIG. 3D, a second lead frame 360 is applied in the electronic package structure 300''' for substituting the circuit substrate 340 of the electronic package structure 300 according to a design requirement. A plurality of first electronic elements 310''' are disposed on the second lead frame 360 and electrically connected to the second lead frame 360. The second lead frame 360 is electrically connected to a first end 332a''' of each lead 332''' of a first lead frame 330''' that extends to a cavity 322a'''.

Second Embodiment

Figure 4A:
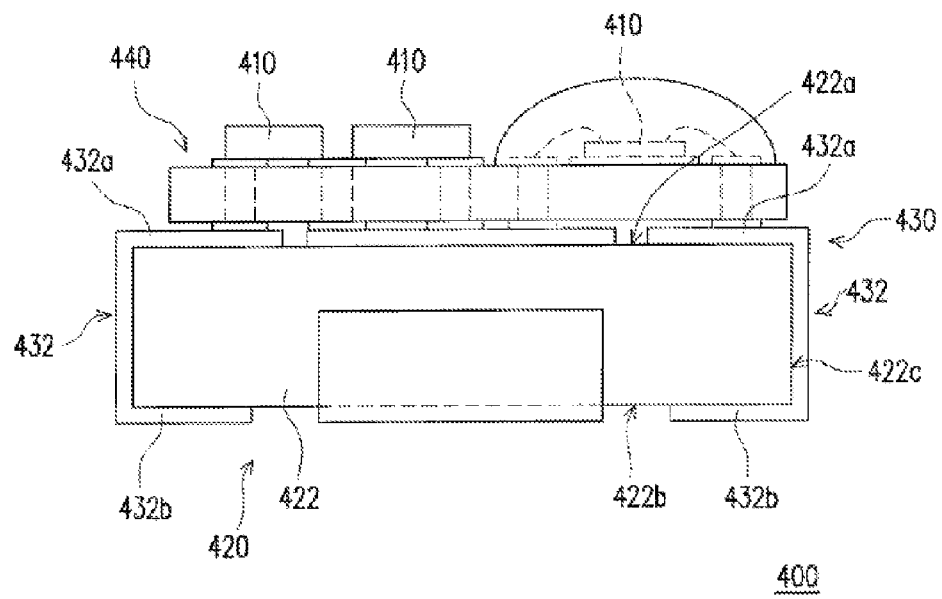
FIG. 4A is a schematic diagram of an electronic package structure according to a second embodiment of the present invention.

FIG. 4A is a schematic diagram of an electronic package structure according to a second embodiment of the present invention. Referring to FIG. 4A and FIG. 3A, a difference between the electronic package structure 400 of the second embodiment and the electronic package structure 300 of the first embodiment is that a body 422 of a second electronic element 420 does not have the cavity 322a. In detail, a first end 432a of each lead 432 of a lead frame 430 is disposed on a first surface 422a of a body 422, and a plurality of first electronic elements 410 are disposed on the first surface 422a and electrically connected to the leads 432. Moreover, a second end 432b of each of the leads 432 is disposed on a second surface 422b of the body 422 opposite to the first surface 422a, and a part of each of the leads 432 connecting the first end 432a and the second end 432b is disposed on a side surface 422c of the body 422.

Furthermore, a circuit substrate 440 is disposed on the first surface 422a and electrically connected to the leads 432, and the first electronic elements 410 are disposed on the circuit substrate 440 and electrically connected to the circuit substrate 440. It should be noted that the circuit substrate 440 of the electronic package structure 400 may be omitted according to a design requirement of the designer, or the circuit substrate 440 may be substituted by a lead frame, though it is not illustrated.

Figure 4B:
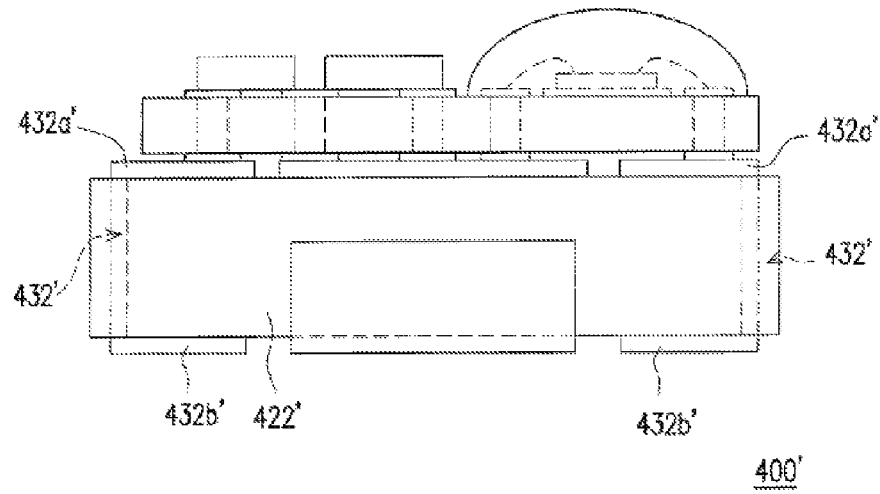
FIG. 4B is a schematic diagram of another electronic package structure according to the second embodiment of the present invention.

FIG. 4B is a schematic diagram of another electronic package structure according to the second embodiment of the present invention. Referring to FIG. 4A and FIG. 4B, a difference between the electronic package structure 400' and the electronic package structure 400 is that a part of each lead 432' connecting a first end 432a' and a second end 432b' penetrates a body 422'.

Third Embodiment

Figure 5A:
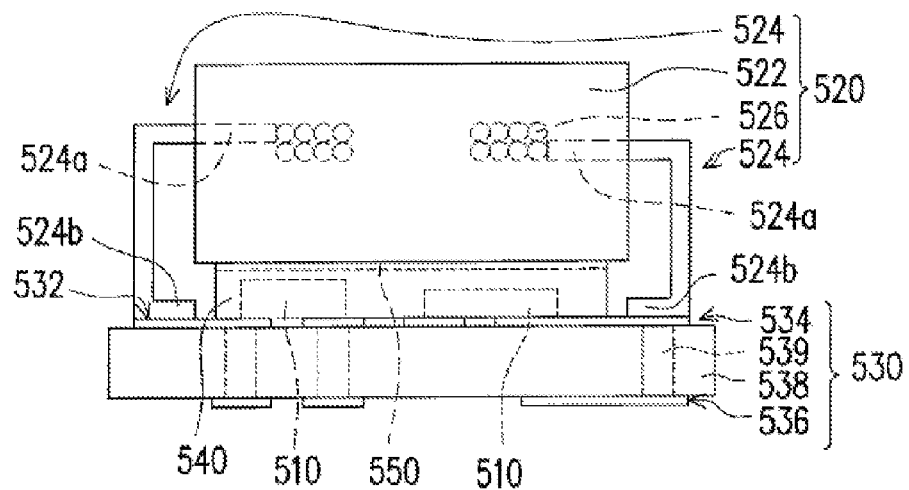
FIG. 5A is a schematic diagram of an electronic package structure according to a third embodiment of the present invention.

FIG. 5A is a schematic diagram of an electronic package structure according to a third embodiment of the present invention. Referring to FIG. 5A, in the electronic package structure 500 of the present embodiment, a plurality of first electronic elements 510 are disposed on a first surface 532 of a circuit substrate 530 and electrically connected to the circuit substrate 530. A second electronic element 520 is disposed above the first surface 532 of the circuit substrate 530. The first electronic elements 510 are located between a body 522 of the second electronic element 520 and the first surface 532 of the circuit substrate 530, and the first electronic elements 510 are located between leads 524 of the second electronic element 520. In other words, in the present embodiment, the second electronic element 520 covers the first electronic elements 510. Besides, an insulating encapsulant 540 is disposed between the second electronic element 520 and the circuit substrate 530 and encapsulating the first electronic elements 510 for protecting the first electronic elements 510 and enhancing a whole mechanical strength of the electronic package structure 500. Moreover, the circuit substrate 530 may further include at least a conductive channel 539, and each of the conductive channels 539 penetrates a dielectric layer 538 for electrically connecting a first circuit layer 534 and a second circuit layer 536. At least one of the conductive channels 539 (for example, the two conductive channels 539 located at a left side of FIG. 5A) is located below at least one of the first electronic elements 510 (for example, the first electronic element 510 located at the left side of FIG. 5A), so that heat generated by the first electronic element 510 located at the left side may be quickly transmitted to where is outside the electronic package structure 500 via the two conductive channels 539 located at the left side. A second end 524b of each of the leads 524 of the second electronic element 520 extends out from the body 522 to electrically connect the circuit substrate 530. The second electronic element 520 may be an inductive element including a coil 526. The body 522 which is a magnetic wrap wraps the coil 526, and a first end 524a of each of the leads 524 is connected to one of two opposite ends of the coil 526.

It should be noted that the electronic package structure 500 further includes an electromagnetic-interference-shielding element (EMI-shielding element) 550 covering the first electronic elements 510. In the present embodiment, the EMI-shielding element 550 is disposed on the body 522 of the second electronic element 520, and is located between the body 522 of the second electronic element 520 and the circuit substrate 530. Therefore, during operation of the electronic package structure 500, it may be reduced by means of the EMI-shielding element 550 that electrical signals transmitted in the circuit substrate 530 is interfered by a magnetic force generated by the second electronic element 520 which functions as an inductive element.

Figure 5B:
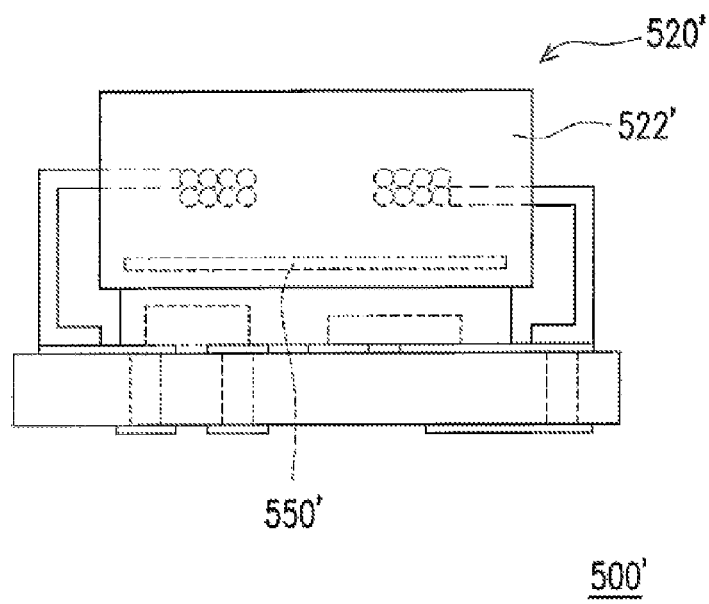
FIG. 5B is a schematic diagram of another electronic package structure according to the third embodiment of the present invention.

FIG. 5B is a schematic diagram of another electronic package structure according to the third embodiment of the present invention. Referring to FIG. 5A and FIG. 5B, a difference between the electronic package structure 500' and the electronic package structure 500 is that an EMI-shielding element 550' of the electronic package structure 500' is disposed in a cavity 522' of a second electronic element 520'.

In summary, in the aforementioned embodiments of the present invention, since the first electronic elements can be disposed in the cavity of the second electronic element or can be disposed on the second electronic element, or the second electronic element can be stacked on the first electronic elements, compared to the conventional electronic package structures, utilization of an internal space of the electronic package structure is relatively high, so that a size of the electronic package structure can be reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An electronic package, comprising:
a substrate;
a coil having a first end and a second end;
a magnetic body encapsulating the coil and positioned over the substrate, wherein the magnetic body has a top surface and a bottom surface;
a first lead, comprising a first portion disposed higher than the bottom surface of the magnetic body and electrically connected to the first end of the coil and a second portion disposed lower than the bottom surface of the magnetic body without contacting the magnetic body and electrically connected to the substrate, wherein the first portion and the second portion of the first lead are integrally formed;
a second lead, comprising a third portion disposed higher than the bottom surface of the magnetic body and electrically connected to the second end of the coil and a fourth portion disposed lower than the bottom surface of the magnetic body without contacting the magnetic body and electrically connected to the substrate, wherein the third portion and the fourth portion of the second lead are integrally formed; and at least one electronic component, disposed between the magnetic body and the substrate.

2. The electronic package as claimed in claim 1, wherein the first portion of the first lead and the third portion of the second lead are disposed between the top surface and the bottom surface of the magnetic body.

3. The electronic package as claimed in claim 1, wherein the second portion of the first lead and the fourth portion of the second lead are disposed on the substrate.

4. The electronic package as claimed in claim 2, wherein the first lead further comprises a fifth portion connecting the first portion and the second portion, wherein the first portion extends out of a first sidewall of the magnetic body to connect to the fifth portion of the first lead; and the second lead further comprises a sixth portion connecting the third portion and the fourth portion, wherein the third portion extends out of a second sidewall of the magnetic body to connect to the sixth portion of the second lead, wherein the fifth portion and the sixth portion are exposed outside the magnetic body without contacting the magnetic body.

5. The electronic package as claimed in claim 3, wherein the second portion of the first lead is disposed on the top surface of the substrate, wherein a conductive via is disposed in the substrate to electrically connect the second portion of the first lead to the bottom surface of the substrate.

6. The electronic package as claimed in claim 3, wherein the at least one electronic component is disposed between the first lead and the second lead outside the magnetic body.

7. The electronic package as claimed in claim 2, further comprising an insulating encapsulant encapsulating the electronic component and disposed under the magnetic body.

8. The electronic package as claimed in claim 4, wherein the first portion and the second portion are disposed in parallel and the fifth portion of the first lead is substantially perpendicular to the first portion and the second portion; and the third portion and the fourth portion are disposed in parallel and the sixth portion of the second lead is substantially perpendicular to the third portion and the fourth portion.

9. The electronic package as claimed in claim 1, wherein the electronic component comprises at least one of a capacitor, a resistor, an inductor, a metal-oxide-semiconductor field effect transistor (MOSFET), an insulated gate bipolar transistor (IGBT) and a diode.

10. The electronic package as claimed in claim 1, further comprising an electromagnetic-interference (EMI) shielding element disposed between the coil and the electronic component.

11. A method for manufacturing an electronic package, the method comprising the steps of:

a. providing a substrate with at least one electronic component thereon, a coil having a first end and a second end, a first lead and a second lead, wherein the first lead comprises a first portion and a second portion, and the second lead comprises a third portion and a fourth portion, wherein the first portion and the second portion of the first lead are integrally formed; and the third portion and the fourth portion of the second lead are integrally formed;

b. electrically connecting the first portion to the first end of the coil and electrically connecting the third portion to the second end of the coil;

c. forming a magnetic body to encapsulate the coil, wherein each of the first portion and the third portion is disposed higher than the bottom surface of the magnetic body; and each of the second portion and the fourth portion is disposed lower than the bottom surface of the magnetic body without contacting the magnetic body; and d. disposing the magnetic body over the substrate and electrically connecting the second portion of the first lead and the fourth portion of the second lead to the substrate, wherein the at least one electronic component is disposed between the magnetic body and the substrate.

12. The method as claimed in claim 11, wherein the first portion and the third portion are disposed between the top surface and the bottom surface of the magnetic body.

13. The method as claimed in claim 11, wherein the second portion and the fourth portion are disposed on the substrate.

14. The method as claimed in claim 12, wherein the first lead further comprises a fifth portion connecting the first portion and the second portion, wherein the first portion extends out of a first sidewall of the magnetic body to connect to the fifth portion of the first lead; and the second lead further comprises a sixth portion connecting the third portion and the fourth portion, wherein the third portion extends out of a second sidewall of the magnetic body to connect to the sixth portion of the second lead, wherein the fifth portion and the sixth portion are exposed outside the magnetic body without contacting the magnetic body.

15. The method as claimed in claim 11, further comprising forming an insulating encapsulant under the magnetic body to encapsulate the electronic component.

* * * * *